United States Patent
Hsieh et al.

(10) Patent No.: US 9,691,943 B2
(45) Date of Patent: Jun. 27, 2017

(54) LIGHT-EMITTING ELEMENT HAVING A REFLECTIVE STRUCTURE WITH HIGH EFFICIENCY

(71) Applicant: Epistar Corporation, Hsinchu (TW)

(72) Inventors: Min-Hsun Hsieh, Hsinchu (TW); Wen-Luh Liao, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 0 days.

(21) Appl. No.: 14/626,075

(22) Filed: Feb. 19, 2015

(65) Prior Publication Data
US 2015/0162501 A1 Jun. 11, 2015

Related U.S. Application Data

(63) Continuation-in-part of application No. 14/286,685, filed on May 23, 2014.

(30) Foreign Application Priority Data

May 24, 2013 (TW) .............................. 102118593 A

(51) Int. Cl.
*H01L 23/00* (2006.01)
*H01L 33/42* (2010.01)
*H01L 33/40* (2010.01)
*H01L 33/38* (2010.01)

(52) U.S. Cl.
CPC ............ *H01L 33/42* (2013.01); *H01L 33/405* (2013.01); *H01L 33/382* (2013.01); *H01L 2933/0016* (2013.01); *H01L 2933/0091* (2013.01)

(58) Field of Classification Search
CPC ... H01L 33/58; H01L 33/48091; H01L 33/42; H01L 33/24; H01L 33/60; H01L 33/20; H01L 33/62; H01L 33/54; H01L 2224/48091
See application file for complete search history.

(56) References Cited

U.S. PATENT DOCUMENTS

| | | | |
|---|---|---|---|
| 7,928,464 B2 | 4/2011 | Lee et al. | |
| 2006/0204865 A1 | 9/2006 | Erchak et al. | |
| 2007/0176191 A1 | 8/2007 | Im | |
| 2012/0126272 A1 | 5/2012 | Kurata et al. | |
| 2012/0273753 A1 | 11/2012 | Tanaka | |

*Primary Examiner* — Hoa B Trinh
(74) *Attorney, Agent, or Firm* — Muncy, Geissler, Olds & Lowe, P.C.

(57) ABSTRACT

A light-emitting device comprises a reflective layer; a first transparent layer on the reflective layer; a light-emitting stack comprising an active layer on the first transparent layer; and a cavity in the first transparent layer.

19 Claims, 18 Drawing Sheets

LIGHT-EMITTING ELEMENT HAVING A REFLECTIVE STRUCTURE WITH HIGH EFFICIENCY

REFERENCE TO RELATED APPLICATION

This application is a continuation-in-part of U.S. patent application Ser. No. 14/286,685, entitled "LIGHT-EMITTING ELEMENT HAVING A REFLECTIVE STRUCTURE WITH HIGH EFFICIENCY", filed May 23, 2014, which claims the right of priority based on TW application Serial No. 102118593, filed on May 24, 2013, and the contents of which are hereby incorporated by reference in its entirety.

TECHNICAL FIELD

The application relates to a light emitting element, and more particularly to a light emitting element having a reflective structure with high efficiency.

DESCRIPTION OF BACKGROUND ART

An optoelectronic element, such as a light-emitting diode (LED), has been applied widely to optical display devices, traffic signals, data storing devices, communication devices, illumination devices, and medical apparatuses. Besides, the LED can be connected with other elements to form a light-emitting apparatus. FIG. 1 illustrates a schematic view of a conventional light-emitting apparatus. As shown in FIG. 1, a conventional light-emitting apparatus 1 includes a submount 12 with a circuit 14; a solder 16 on the submount 12, wherein an LED 11 is adhesively fixed on the submount 12 by the solder 16; and an electrical connecting structure 18 is electrically connecting the electrode 15 and the circuit 14 on the submount 12. Wherein, the submount 12 can be a lead frame or a mounting substrate.

SUMMARY OF THE DISCLOSURE

A light-emitting device comprises a reflective layer; a first transparent layer on the reflective layer; a light-emitting stack comprising an active layer on the first transparent layer; and a cavity in the first transparent layer.

DETAILED DESCRIPTION OF PREFERRED EMBODIMENTS

Figure 1:
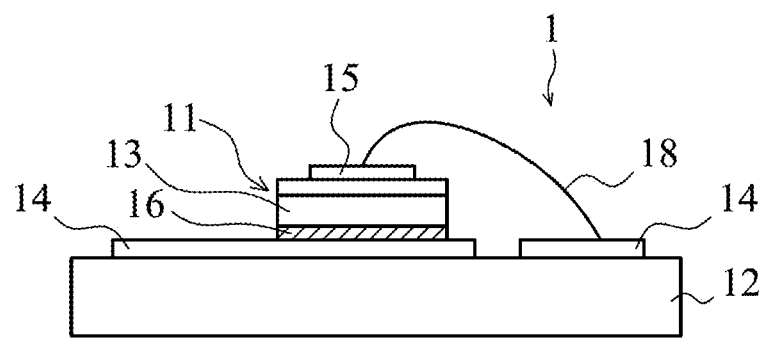
FIG. 1 shows an illustration of a conventional light-emitting apparatus.

The embodiments of the present application are described in detail and presented in the drawings. The same or similar parts are indicated with the same numbers in the drawings and the specification.

Figure 2:
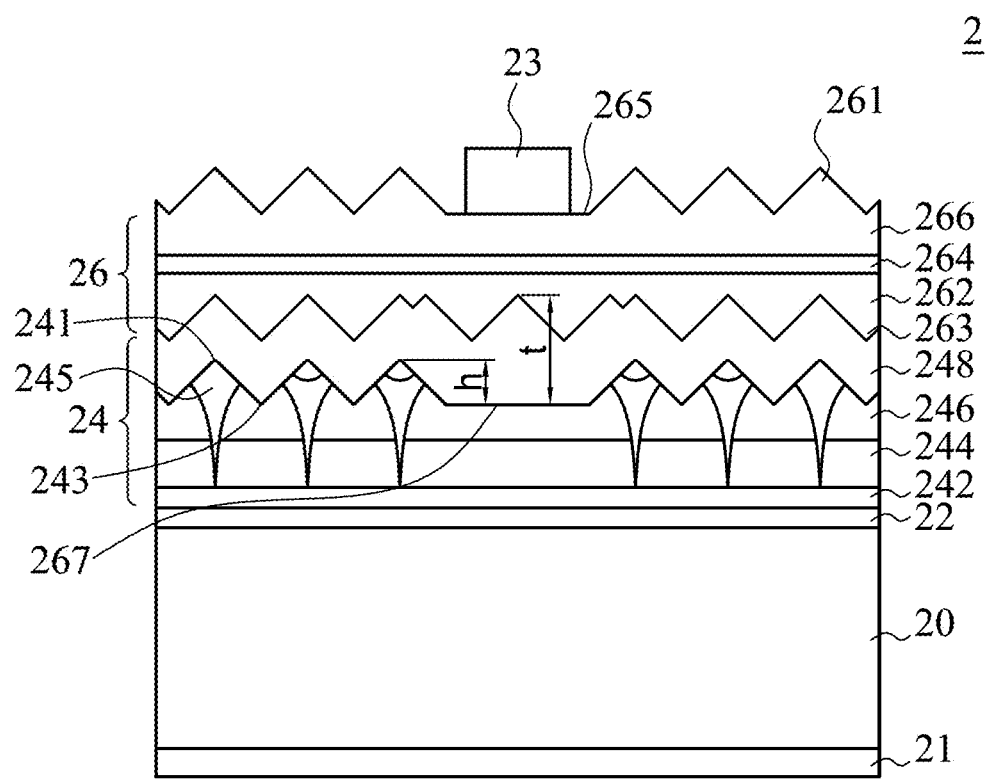
FIG. 2 shows an illustration of a cross section of a light-emitting element in accordance with one embodiment of the present application.

FIG. 2 shows a cross section of a light-emitting element in accordance with one embodiment of the present application. As shown in FIG. 2, the light-emitting element 2 includes a substrate 20, an adhesive layer 22 being disposed on the substrate 20, a reflective structure 24 being disposed on the adhesive layer 22, a light-emitting stack 26 being disposed on the reflective structure 24, a first electrode 21 being disposed under the substrate 20, and a second electrode 23 being disposed on the light-emitting stack 26. The light-emitting stack 26 includes a first semiconductor layer 262 being disposed on the reflective structure 24, an active layer 264 being disposed on the first semiconductor layer 262, and a second semiconductor layer 266 being disposed on the active layer 264.

The first electrode 21 and/or the second electrode 23 can receive the external voltage and can be composed of the transparent conductive material or the metal material. The transparent conductive material includes but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Zinc Oxide (IZO), Diamond-like Carbon (DLC), Indium Gallium Oxide (IGO), Gallium Aluminum Zinc Oxide (GAZO), or the combination thereof. The metal material includes but is not limited to Aluminum (Al), Chromium (Cr), Copper (Cu), Tin (Sn), Gold (Au), Nickel (Ni), Titanium (Ti), Platinum (Pt), Lead (Pb), Zinc (Zn), Cadmium (Cd), Antimony (Sb), Cobalt (Co), or the alloy thereof.

The light-emitting stack 26 includes a rough upper surface 261 and a rough lower surface 263 to reduce the probability of internal total reflection and to enhance the light extraction efficiency. The rough upper surface includes a flat portion 265 which the second electrode 23 could be disposed thereon to enhance the adhesion between the second electrode 23 and the light-emitting stack 26 and to reduce the probability the second electrode 23 peeling off from the light-emitting stack 26 due to the sequential manufacturing processes such as wire bonding. The material of the light-emitting stack 26 could be a semiconductor material including more than one element such as Gallium (Ga), Aluminum (Al), Indium (In), Phosphorous (P), Nitrogen (N), Zinc (Zn), Cadmium (Cd), and Selenium (Se). The first semiconductor layer 262 and the second semiconductor layer 266 have different polarities and are used to produce electrons and holes. The active layer 264 can emit one single color or multiple colors, and the color(s) can be visible or invisible. The structure of the active can be a hetero-structure, a double hetero-structure, a double-sided double hetero-structure, a multi-layered multi-quantum-well structure, or a quantum-dot structure.

The reflective structure 24, along the direction from the adhesive layer 22 toward the light-emitting stack 26, includes a reflective layer 242, a first transparent layer 244, and a window layer 248. Optionally, a second transparent layer 246 can be formed additionally. In one embodiment, only the first transparent layer 244 is presented. In such embodiment, the window layer 248 includes a rough lower surface, and the rouge lower surface includes a plurality of protruding portions 241 and concave portions 243. Wherein, the rough lower surface further includes a flat portion located right under the second electrode 23 being used to form an ohmic contact with the first transparent layer 244. At least one cavity 245 is formed in the first transparent layer 244 and the cavity 245 can be extended from rough lower surface of the window layer 248 downward to the reflective layer 242. In another embodiment, the cavity 245 can be extended from the protruding portion 241 downward to the reflective layer 242. Wherein, the refractive index of the cavity 245 is smaller than the refractive indices of the window layer 248 and the first transparent layer 244. Because the refractive index of the cavity 245 is smaller than the refractive indices of the window layer 248 and the first transparent layer 244, the critical angle at the interface between the window layer 248 and the cavity 245 is smaller than the critical angle at the interface between the window layer 248 and the first transparent layer 244. After the light which is emitted from the light-emitting stack 26 emitting toward the cavity 245, the probability of the total reflection occurred at the interface between the window layer 248 and the cavity 245 increases. Besides, if the light at the interface between the window layer 248 and the cavity 245 not forming a total reflection and entering the first transparent layer 244, the total reflection is also occurred at the interface between the first transparent layer 244 and the cavity 245 and therefore to enhance the light extraction efficiency of the light-emitting element 2. Taking a view of the cross section, the cavity 245 is in the shape of a funnel with a wide upper part and a narrow lower part.

In another embodiment, the reflective structure 24 can further include a second transparent layer 246 located between part of the first transparent layer 244 and the window layer 248 to enhance the adhesion and the spreading of the current between the first transparent layer 244 and the window layer 248. In another embodiment, the second transparent layer 246 can include a cavity 245, and wherein the refractive index of the cavity 245 is smaller than the refractive indices of the window layer 248 and the second transparent layer 246. Because the refractive index of the cavity 245 is smaller than the refractive indices of the window layer 248 and the second transparent layer 246, the critical angle at the surface between the second transparent layer 246 and the cavity 245 is smaller than the critical angle at the surface between the window layer 248 and the second transparent layer 246. After the light which is emitted from the light-emitting stack 26 emitting toward the cavity 245, the probability of the total reflection occurred at the interface between the second transparent layer 246 and the cavity 245 increases. In another embodiment, the reflective structure 24 does not have the window layer 248, and the first transparent layer 244 is formed under the light-emitting stack 26. In the embodiment, the rough lower surface 263 of the light-emitting stack 26 includes a plurality of protruding portions and concave portions and therefore is favorable of forming the cavity 245.

The window layer 248 is transparent to the light emitted by the light-emitting stack 26 and is used to enhance the light extraction efficiency. The material of the window layer can be a conductive material, which includes but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Zinc Oxide (IZO), Diamond-like Carbon (DLC), Indium Gallium Oxide (IGO), Gallium Aluminum Zinc Oxide (GAZO), or the combination thereof. The height difference h between the concave portion 243 and the protruding portion 241 of the rough lower surface is about $1/3$ to $2/3$ the thickness of the window layer and is favorable of forming the cavity 245.

The materials of the first transparent layer 244 and/or the second transparent layer 246 are transparent to the light emitted by the light-emitting stack 26 and is used to increase the adhesion and the spreading of the current between the window layer 248 and the reflective layer 242. Besides, the materials of the first transparent layer 244 and/or the second transparent layer 246 can form an Omni-Directional Reflector (ODR) with the reflective layer 242. The material of the first transparent layer 244 and/or the second transparent layer 246 can be a transparent conductive material which includes but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Zinc Oxide (IZO), Diamond-like Carbon (DLC), Indium Gallium Oxide (IGO), Gallium Aluminum Zinc Oxide (GAZO), or the combination thereof. The method of forming the first transparent layer 244 and/or the second transparent layer 246 includes the physical vapour deposition method, such as E-beam deposition or sputtering. The reflective layer can reflect the light from the light-emitting stack 26 and the material can be a metal material, which includes but is not limited to Copper (Cu), Aluminum (Al), Tin (Sn), Gold (Au), Silver (Ag), Lead (Pb), Titanium (Ti), Nickel (Ni), Platinum (Pt), Tungsten (W), or the alloy thereof.

The adhesive layer 22 can connect the substrate 20 and the reflective structure 24 and can include a plurality of sublayers (not shown). The material of the adhesive layer 22 can be a transparent conductive material or a metal material, the transparent conductive material includes but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Cerium Oxide (ICO), Indium Tungsten Oxide (IWO), Indium Titanium Oxide (ITiO), Indium Zinc Oxide (IZO), Indium Gallium Oxide (IGO), Gallium Aluminum Zinc Oxide (GAZO), or the combination thereof. The metal material includes but is not limited to Copper (Cu), Aluminum (Al), Tin (Sn), Gold (Au), Silver (Ag), Lead (Pb), Titanium (Ti), Nickel (Ni), Platinum (Pt), Tungsten (W), or the alloy thereof.

The substrate 20 can be used to support the light-emitting stack 26 thereon and other layers or structures, and its material can be a transparent material or a conductive material. The transparent material can include but is not limited to Sapphire, Diamond, Glass, Epoxy, Quartz, Acryl, Aluminum Oxide ($Al_2O_3$), Zinc Oxide (ZnO), or Aluminum Nitride (AlN) and so on. The conductive material can include but is not limited to Copper (Cu), Aluminum (Al), Molybdenum (Mo), Tin (Sn), Zinc (Zn), Cadmium (Cd), Nickel (Ni), Cobalt (Co), Diamond Like Carbon (DLC), Graphite, Carbon fiber, Metal Matrix Composite (MMC), Ceramic Matrix Composite (CMC), Silicon (Si), Zinc Selenium (ZnSe), Gallium Arsenide (GaAs), Silicon Carbide (SiC), Gallium Phosphide (GaP), Gallium Arsenic Phosphide (GaAsP), Lithium Gallium Oxide (LiGaO$_2$), or Lithium Aluminum Oxide (LiAlO$_2$).

Figure 3:
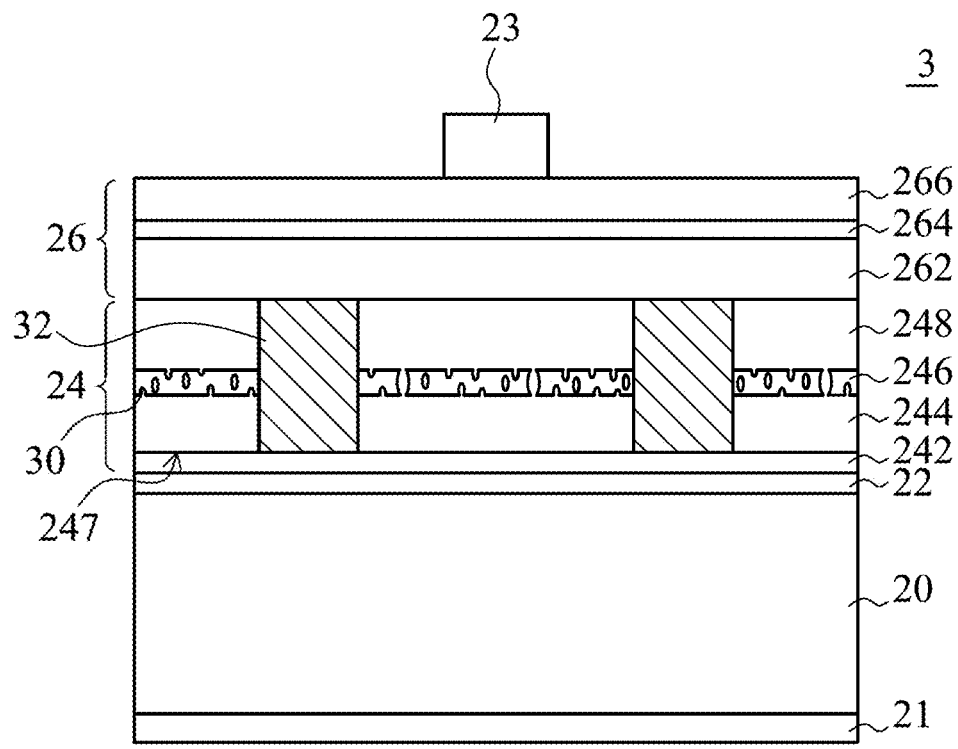
FIG. 3 shows an illustration of a cross section of a light-emitting element in accordance with another embodiment of the present application.
Figure 4:
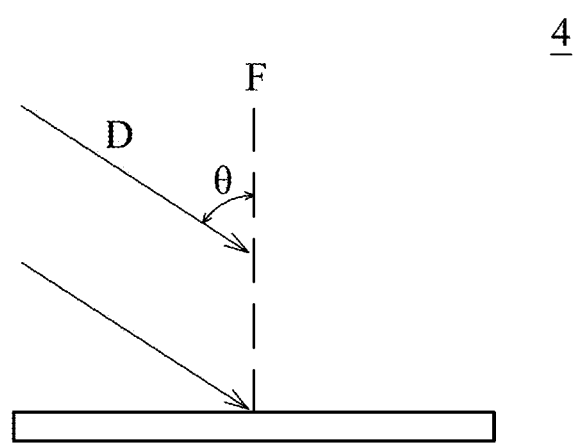
FIG. 4 shows an illustration of the deposition direction of the second transparent layer in accordance with the embodiment shown in FIG. 3.

FIG. 3 discloses a cross section of a light-emitting element in accordance of another embodiment of the present application. A light-emitting element 3 includes a similar structure to the aforementioned light-emitting element 2, but the second transparent layer 246 of the reflective structure 24 includes a plurality of cavities 30 so that the refractive index of the second transparent layer 246 is smaller than 1.4, and is preferred to be 1.35. As shown in FIG. 4, the cavities 30 are formed by fixing the wafer 4 to a specific direction, such as the direction D which has an included angle θ with the normal perpendicular to the wafer, to deposit the material of the second transparent layer 246 onto the wafer by the physical vapour deposition method. Because of the adjustment of the deposition direction D, there are some areas that the material is not deposited onto and the cavities are formed. Wherein, the included angle is about 60 degrees. The refractive index of the second transparent layer 246 with cavities 30 is smaller than the transparent layer without the cavities, the probability of the total reflection occurred at the interface between the second transparent layer 246 and another layer can be increased, and therefore the light extraction efficiency of the light-emitting element 3 is enhanced. The first transparent layer 244 can be formed by the physical vapour deposition method or the chemical vapour deposition method under the second transparent layer 246 and has a thickness larger than that of the second transparent layer 246 so that it can prevent the material of the reflective layer 242 from diffusing into the cavities and destroying the structure of the reflective layer 242 and decrease the reflectivity of the reflective layer 242. The first reflective layer 244 includes a lower surface 247, which can be polished by the chemical mechanical polishing method (CMP) to make it has an average roughness of the center line (Ra) about 1 nm~40 nm. When the reflective layer 242 is formed under the first lower surface 247, the reflective layer 242 can form a surface with a lower average roughness of the center line (Ra) and therefore increase the reflectivity of the reflective layer 242.

The light-emitting element 3 further includes a conductive portion 32 located between the light-emitting stack 26 and the reflective layer 242. In another embodiment, the conductive portion 32 can be located between the window layer 248 and the reflective layer 242. The conductive portion 32 can conduct the current. The material of the conductive portion can be a transparent conductive material or a metal material. The transparent conductive material can be but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Cerium Oxide (ICO), Indium Tungsten Oxide (IWO), Indium Titanium Oxide (ITiO), Indium Zinc Oxide (IZO), Indium Gallium Oxide (IGO), Gallium Aluminum Zinc Oxide (GAZO), or the combination thereof. The metal material includes but is not limited to Copper (Cu), Aluminum (Al), Tin (Sn), Gold (Au), Silver (Ag), Lead (Pb), Titanium (Ti), Nickel (Ni), Platinum (Pt), Tungsten (W), Germanium (Ge), or the alloy thereof.

In this embodiment, the material of the first transparent layer 244 and/or the second transparent layer 246 can be an insulating material such as Polyimide (PI), Benzocyclobutene (BCB), Perfluorocyclobutane (PFCB), Magnesium oxide (MgO), SUB, Epoxy, Acrylic resin, Cycloalkenes Copolymer (COC), Poly(methyl methacrylate) (PMMA), Poly (ethylene terephthalate) (PET), Polycarbonate (PC), Polyetherimide, Fluorocarbon polymer, Glass, Aluminum Oxide (Al$_2$O$_3$), Silicon Oxide (SiOx), Titanium Oxide (TiO$_2$), Tantalic Oxide (Ta$_2$O$_5$), Silicon Nitride (SiNx), Magnesium Fluoride (MgF$_2$), Spin-on-glass (SOG), or Tetraethyl orthosilicate (TEOS).

Figure 5:
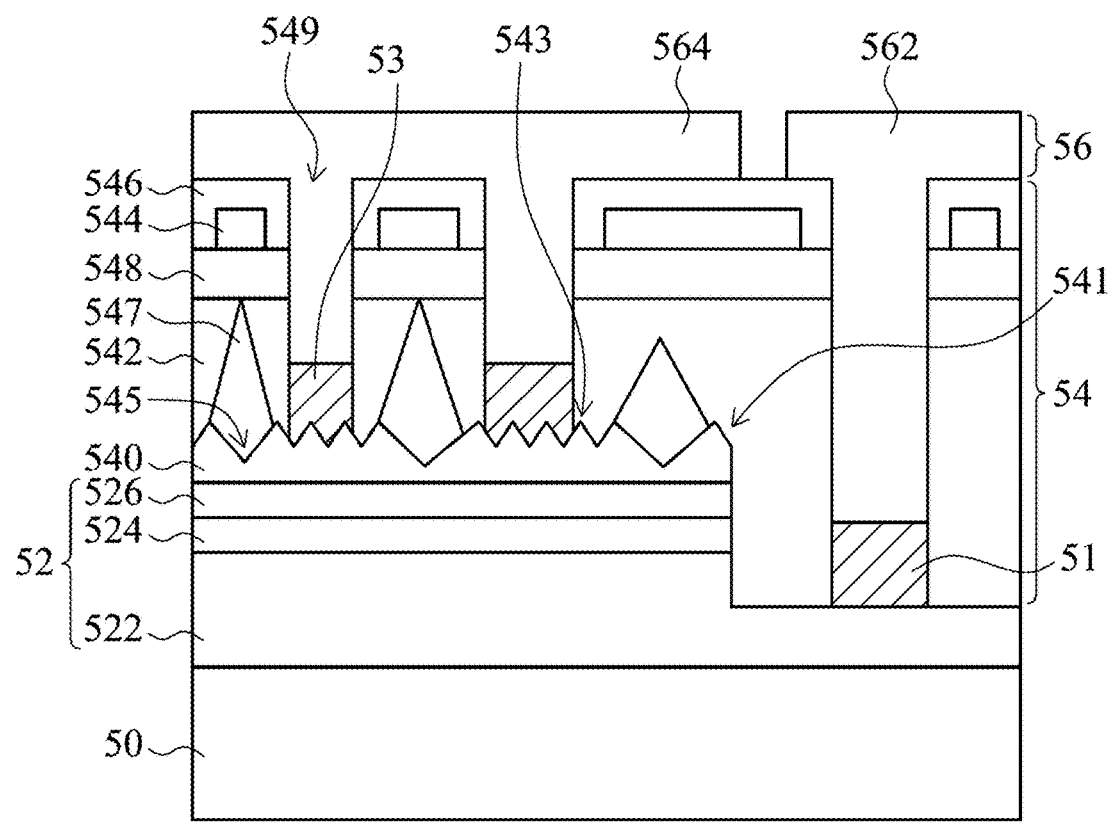
FIG. 5 shows an illustration of a cross section of a light-emitting element in accordance with another embodiment of the present application.

FIG. 5 discloses a cross section of a light-emitting element in accordance of another embodiment of the present application. As shown in FIG. 5, a light-emitting element 5 includes a substrate 50; a light-emitting stack 52 on the substrate 50; a reflective structure 54 on the light-emitting stack 52; and an electrode 56 on the reflective structure 54. The light-emitting stack 52 includes a first semiconductor layer 522 located on the substrate 50; an active layer 524 located on the first semiconductor layer 522; and a second semiconductor layer 526 located on the active layer 524. Wherein, a portion of the semiconductor layer 526 and the active layer 524 are removed in order to expose the first semiconductor layer 522.

The reflective structure 54 includes a window layer 540 located on the light-emitting stack 52; a first transparent layer 542 located on the window layer 540; a reflective layer 544 located on the first transparent layer 542; and a first insulating layer 546 located on the reflective layer 544. The window layer 540 includes a rouge upper surface 541, and the rouge upper surface includes a plurality of protruding portions 543 and concave portions 545. At least one cavity 547 is formed in the first transparent layer 542 and on the rough upper surface 541. The refractive index of the cavity 547 is smaller than the refractive indices of the window layer 540 and of the first transparent layer 542. In another embodiment, the cavities 547 can be extended upward from the concave portions 545. Because the refractive index of the cavities 547 is smaller than the refractive indices of the window layer 540 and the first transparent layer 542, the critical angle at the interface between the window layer 540 and the cavities 547 is smaller than the critical angle at the interface between the window layer 540 and the first transparent layer 542. After the light which is emitted from the light-emitting stack 52 emitting toward the cavity 547, the probability the total reflection occurred at the interface between the window layer 540 and the cavity 547 increases. Besides, the light not forming a total reflection at the interface between the window layer 540 and the first transparent layer 542 enters the first transparent layer 542 and the total reflection is occurred at the interface between the first transparent layer 542 and the cavity 547 and therefore to enhance the light extraction efficiency of the light-emitting element 5. Viewing from the cross section, the cavity 547 is in the shape of a funnel with a wide upper part and a narrow lower part. Because the probability of the total reflection occurred for the light emitted from the light-emitting stack 52 at the interface between the window layer 540 and the cavities 547 and at the interface between the first transparent layer 542 and the cavities 547 increases, the probability the light arrives to the electrode 56 and is absorbed by the electrode 56 is decreased, and the light extraction efficiency of the light-emitting element 5 is increased. The first insulating layer 546 can cover the reflective layer 544 so that the reflective layer 544 does not directly contact with the electrode 56 in order to prevent the material of the reflective layer 544 from diffusing to the electrode 56 and decreasing the reflectivity of the reflective layer 544. The reflective structure 54 further includes a plurality of channels 549 formed in the first transparent layer 542 and in the first insulating layer 546 so that the electrode 56 can electrically contact with the light-emitting stack 52 through the channels 549. The reflective structure 54 can further include a second transparent layer 548 located between part of the first transparent layer 542 and the reflective layer 544. The second transparent layer 548 does not include the cavities so that it can prevent the material of the reflective layer 544 from diffusing to the cavities and destroying the structure of the reflective structure 544, which degrades the reflectivity of the reflective layer 544.

The electrode 56 includes a first conductive layer 562 and a second conductive layer 564, and wherein the first conductive layer 562 and the second conductive layer 564 does not contact each other. The first conductive layer 562 connects the first semiconductor layer 522 through the channels 549, and the second conductive layer 564 connects the window layer 540 through the channels 549. In another embodiment, the light-emitting element 5 further includes a first contact layer 51 located between the first conductive layer 562 and the first semiconductor layer 522 in order to increase the adhesion between the first conductive layer 562 and the first semiconductor layer 522. The second contact layer 53 is located between the second conductive layer 564 and the window layer 540 in order to increase the adhesion between the second conductive layer 564 and the window layer 540, to decrease the operating voltage of the light-emitting element 5, and to increase the efficiency. Wherein, the materials of the first contact layer 51 and the second contact layer 52 is the same as the materials of the aforementioned electrodes.

Figure 6:
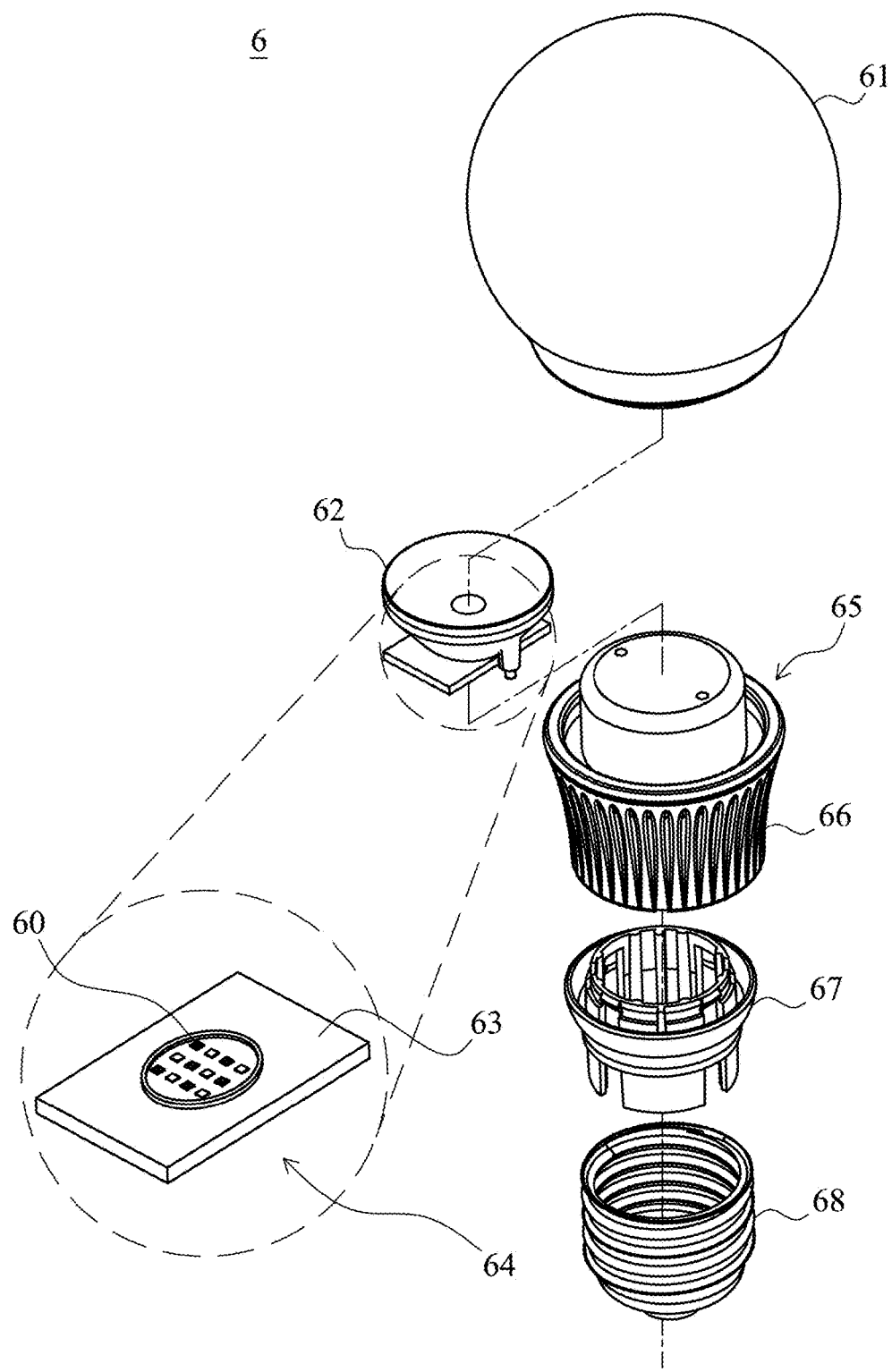
FIG. 6 shows an illustration of the explosion of a light bulb in accordance with one embodiment of the present application.

FIG. 6 discloses an illustration of the explosion of a light bulb. A light bulb 6 includes a globe 61, a lens 62 located in the globe 61, a light-emitting module 64 located under the lens 62, a lampstand 65 including a heat dissipation tank 66 used to support the light-emitting module 64, a connecting portion 67, and an electrical connecting apparatus 68. Wherein, the connecting portion 67 connects the lampstand 65 and the electrical connecting apparatus 68. The light-emitting module 66 includes a supporting body 63 and a plurality of the light-emitting elements 60 in accordance with any one of the aforementioned embodiment located on the supporting body 63.

Figure 7A:
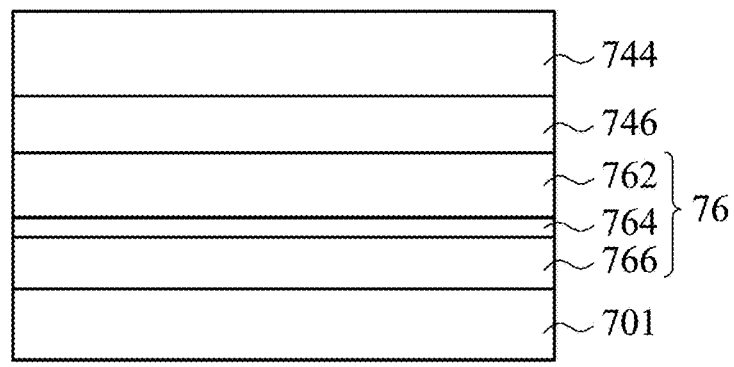
FIGS. 7A to 7G disclose a light-emitting element and manufacturing method thereof in accordance with another embodiment of the present application.

FIGS. 7A to 7G disclose a light-emitting element and the manufacturing method thereof in accordance with another embodiment of the present application. As shown in FIG. 7A, the method for forming the light-emitting element comprises providing a growth substrate 701 and forming a light-emitting stack 76 on the growth substrate 701. The light-emitting stack 76 sequentially comprises a first semiconductor layer 762, an active layer 764, and a second semiconductor layer 766 on the growth substrate 701. The first semiconductor layer 762 and the second semiconductor layer 766 are of different conductive types. For example, the first semiconductor layer 762 is a p-type semiconductor layer, and the second semiconductor layer 766 is an n-type semiconductor layer. The first semiconductor layer 762, the active layer 764, and the second semiconductor layer 766 comprise III-V group material, such as $Al_gIn_hGa_{(1-g-h)}P$ ($0 \le g \le 1$, $0 \le h \le 1$, $0 \le g+h \le 1$) materials. Next, a first transparent layer 744 is formed on the light-emitting stack 76. A second transparent layer 746 can be optionally formed before the first transparent layer 744 is formed. In one embodiment, the second transparent layer 746 forms an ohmic contact with the light-emitting stack 76. In another embodiment, the second transparent layer 746 enhances the adhesion or the ability of current spreading between the first transparent layer 744 and the light-emitting stack 76. The materials of the first transparent layer 744 and the second transparent layer 746 are transparent to the light emitted by the light-emitting stack 76. The materials of the first transparent layer 744 and the second transparent layer 746 comprise a transparent conductive material which includes but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Zinc Oxide (IZO), Diamond-like Carbon (DLC), Indium Gallium Oxide (IGO), Gallium Aluminum Zinc Oxide (GAZO), or the combination thereof. In the present embodiment, the first transparent layer 744 comprises Indium-Tin Oxide (ITO) and the second transparent layer 746 comprises Gallium Phosphide (GaP). In another embodiment, the first transparent layer 744 comprises a first transparent conductive oxide and the second transparent layer 746 comprises a second transparent conductive oxide different from the first transparent conductive oxide.

Figure 7B:
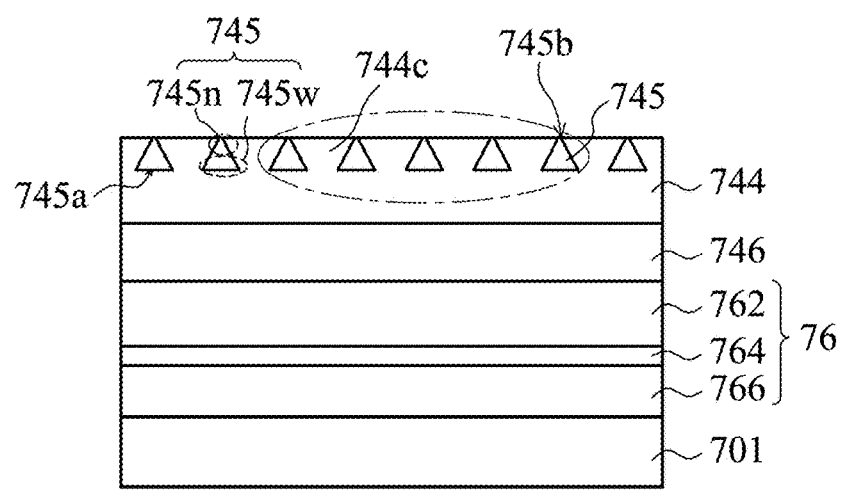
Figure 7B:
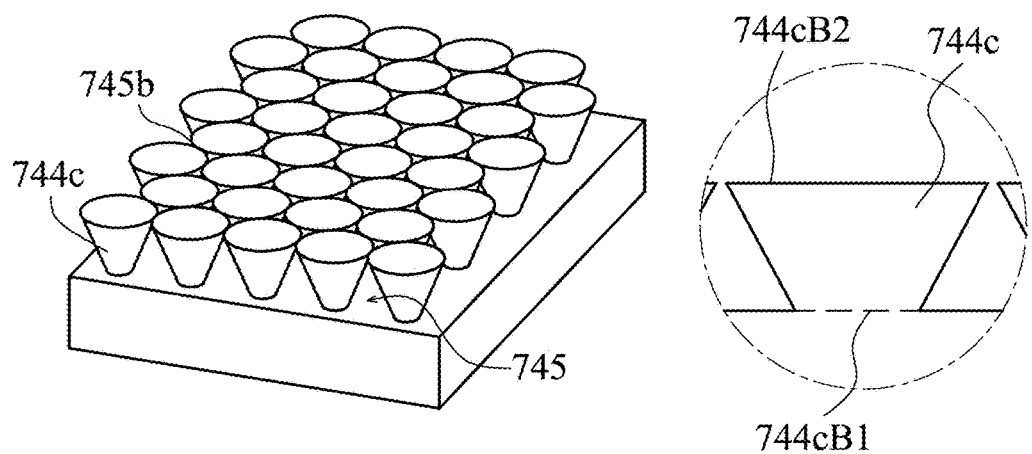

Next, as shown in FIG. 7B, the method further comprises forming cavities 745 in the first transparent layer 744. In the present embodiment, the cavity 745 is formed by an etching method. For example, the etching method comprises using a chemical solution to etch along a grain boundary 745b of the first transparent layer 744. The chemical solution comprises a solution of acid. The acid comprises Oxalic Acid (($COOH)_2.2H_2O$), Hydrochloric Acid (HCl), or a mixture of Sulfuric Acid ($H_2SO_4$) and Hydrofluoric Acid (HF). Depending on the control of the etching step, such as the etching time or the composition of the etching solution, a cross-sectional shape of the cavity 745 comprises substantially a triangle or a trapezoid. A small opening is formed around the top of the cavity 745. In either case, a first part 744w of the cavity 745 which is closer to the light-emitting stack 76 is wider than a second part 744n of the cavity 745 which is remoter from the light-emitting stack 76. The plurality of cavities 745 are intercommunicated with each other as shown in the lower left diagram of FIG. 7B for clearer illustration. The first transparent layer 744 comprises a plurality of rods 744c substantially separated from each other but compactly arranged, and each of the rods 744c is surrounded by the cavities 745 as shown in FIG. 7B. The cavities 745 and the rods 744c form a porous structure. The rods 744c are in a form of an inverted truncated cone or an inverted truncated pyramid. Each of the rods 744c comprises substantially a cross-sectional shape of an inverted trapezoid. Similarly, the cross-sectional shape of the rods 744c can be controlled by controlling of the etching step, such as the etching time or the composition of the etching solution. In one embodiment, as shown in the lower right magnified diagram of FIG. 7B for clearer illustration, a lower base 744cB1 of each rod 744c is larger than 1/3 of a upper base 744cB2 of the rod 744c from a cross-sectional view for maintaining the mechanical stability. In the case where the rod 744c is formed to be a truncated cone, and the cross-sectional shape comprises a trapezoid with the lower base 744cB1 larger than 1/3 of the upper base 744cB2, a total bottom area of the cavities 745, i.e., a total area of all bottom faces 745a of all the cavities, is between 50% and 90% of the area of the light-emitting stack 76. That is, a projected area of the all the cavities 745 onto the light-emitting stack 76 is between 50% and 90% of an area of a surface of the light-emitting stack 76. After the etching step, de-ionized water may be used to rinse to remove the chemical solution from the first transparent layer 744. After etching the first transparent layer 744 to form the cavities 745, the method optionally comprises performing a thermal treatment to the first transparent layer 744 to reduce the sheet resistance of the first transparent layer 744.

Figure 7C:
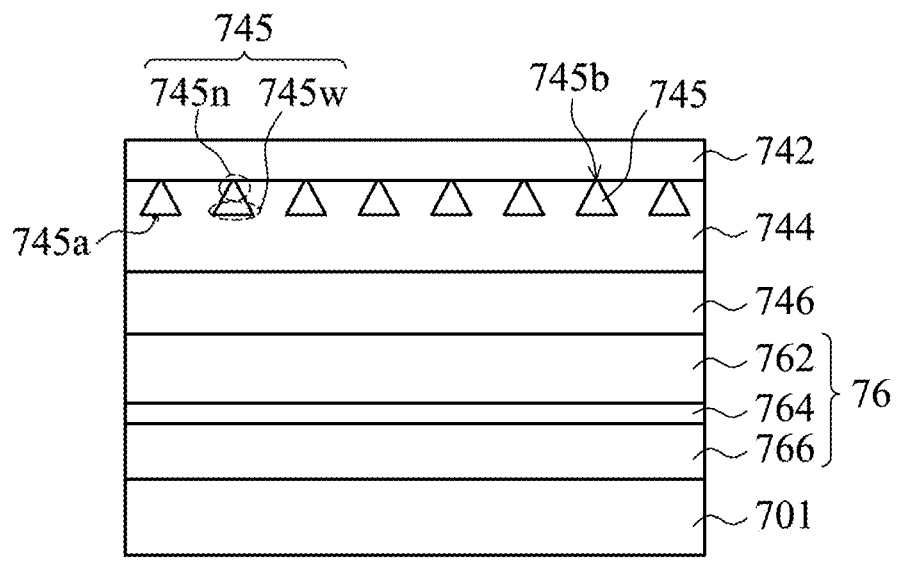

Next, as shown in FIG. 7C, the method further comprises forming a reflective layer 742 on the first transparent layer 744. Because the opening of the cavity 745 is small enough, the reflective layer 742 does not fill into the cavity and leave an air gap in the cavity 745. The reflective layer 742 comprises metal material, such as gold (Au), silver (Ag), or aluminum (Al). In one embodiment, the reflective layer 742 comprises a DBR (Distributed Bragg Reflector) structure. The DBR structure comprises a plurality of DBR pairs, wherein each DBR pair is composed of a layer having a high refractive index and a layer having a low refractive index. The reflective layer 742, the first transparent layer 744 and/or the second transparent layer 746 together form an Omni-Directional Reflector (ODR).

Figure 7D:
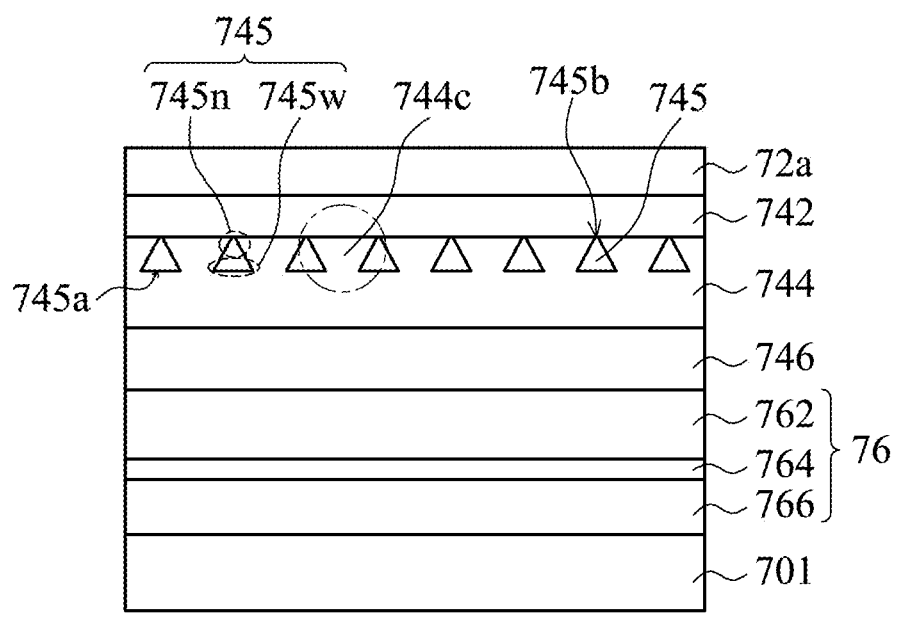
Figure 7E:
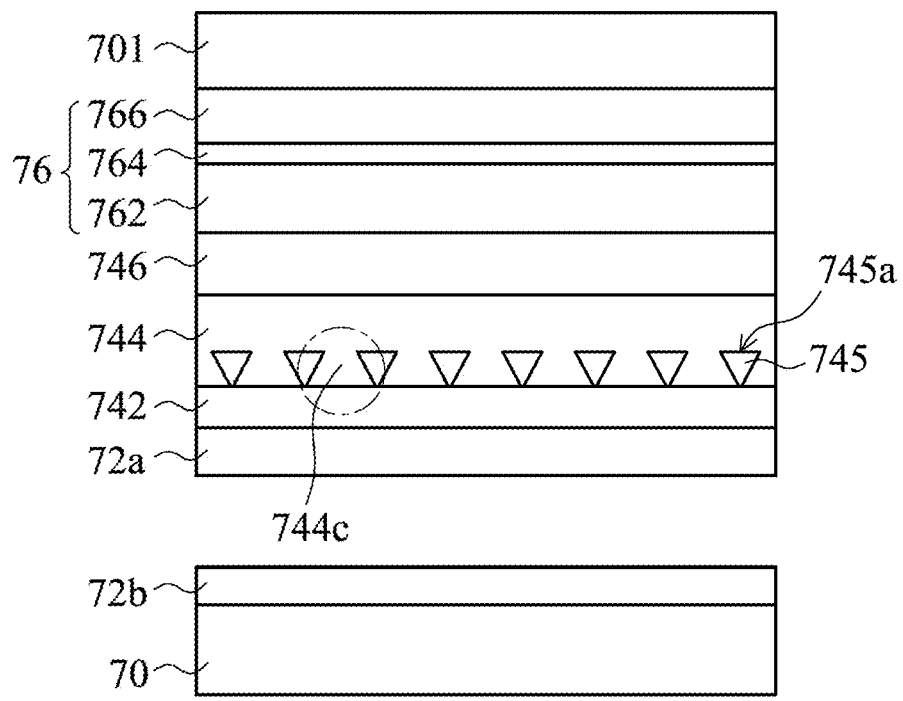
Figure 7F:
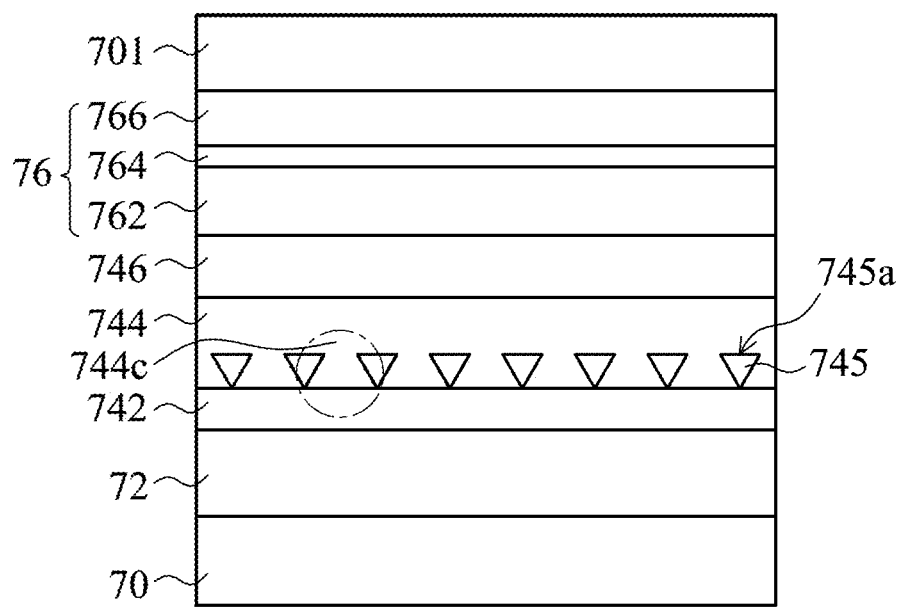
Figure 7G:
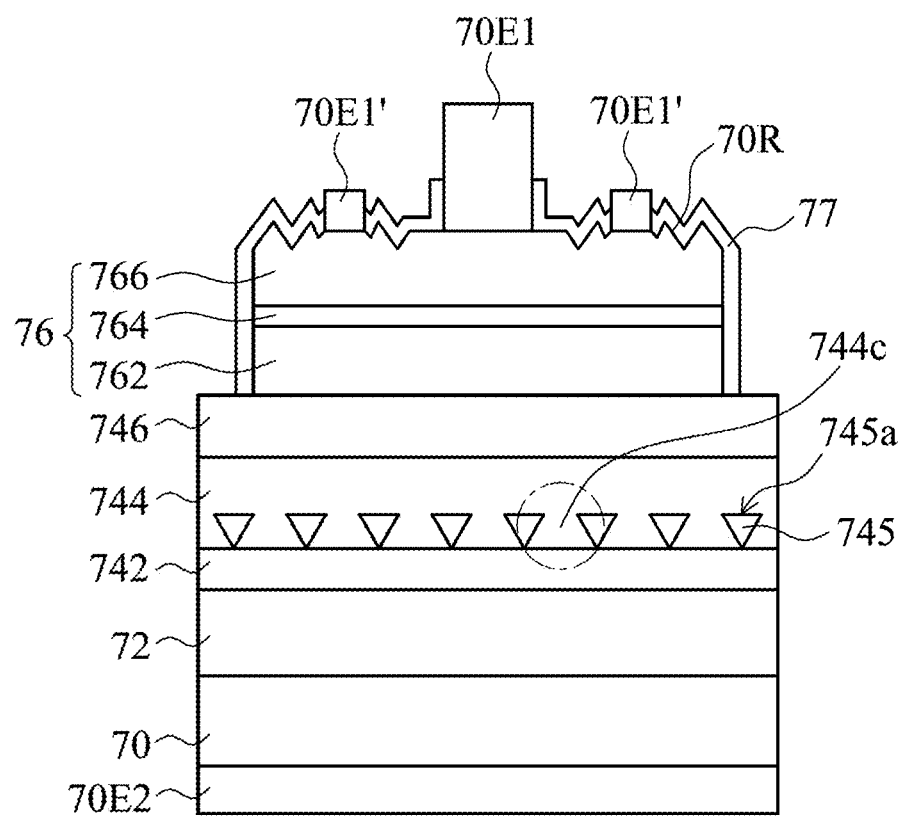

Next, as shown in FIG. 7D, the method further comprises forming a first bonding layer 72a on the reflective layer 742. As shown in FIG. 7E, the method further comprises providing a substrate 70, and forming a second bonding layer 72b on the substrate 70. The substrate 70 is a conductive substrate, such as a Si substrate. The first bonding layer 72a and the second bonding layer 72b comprise gold (Au), indium (In), tin (Sn), silver (Ag), Copper (Cu), nickel (Ni), bismuth (Bi) or the alloy thereof. Then, as shown in FIG. 7F, the bonding layer 72a and the bonding layer 72b are bonded together to form an adhesive layer 72. After bonding, the growth substrate 701 is removed, as shown in FIG. 7G. Then, a first bonding pad 70E1 and an extending electrode 70E1' are formed on the second semiconductor layer 766. A second bonding pad 70E2 is formed on the substrate 70. A roughening process is optionally performed to the second semiconductor layer 766 to form a roughened surface 70R for increasing the light extraction efficiency. Then, a lithography process and an etching process are performed to remove a peripheral part of the light-emitting stack 76 and expose the second transparent layer 746. The second transparent layer 746 may be slightly over etched. Finally, a passivation layer 77 covers the roughened surface 70R and a sidewall of the light-emitting stack 76 to protect the light-emitting element from the damage by the atmosphere. In the present embodiment, the passivation layer 77 also covers the sidewalls of the light-emitting stack 76 for better protection.

FIG. 7G shows a light-emitting device in accordance with the present disclosure. The light-emitting device 7 comprises sequentially the substrate 70, the adhesive layer 72, the reflective layer 742, the first transparent layer 744, the second transparent layer 746, and the light-emitting stack 76. The light-emitting stack 76 sequentially comprises the first semiconductor layer 762, the active layer 764, and the second semiconductor layer 766 with the roughened surface 70R. The first bonding pad 70E1 and the extending electrode 70E1' are on the second semiconductor layer 766. The second bonding pad 70E2 is on the substrate 70. The passivation layer 77 covers the roughened surface 70R and the sidewall of the light-emitting stack 76. The first transparent layer 744 comprises the rods 744c surrounded by the cavities 745. The cavities 745 and the rods 744c form a porous structure. When light emitted by the light-emitting stack 76 reaches the first transparent layer 744, light is reflected or scattered by the cavity 745 due to the total internal reflection between the interface of the first transparent layer 744 and the cavity 745 having air gap therein. Therefore, the light extraction efficiency of the light-emitting element 7 is enhanced. The detail of each structure in the light-emitting device 7 has been described in the foregoing descriptions for FIGS. 7A to 7F.

Figure 8A:
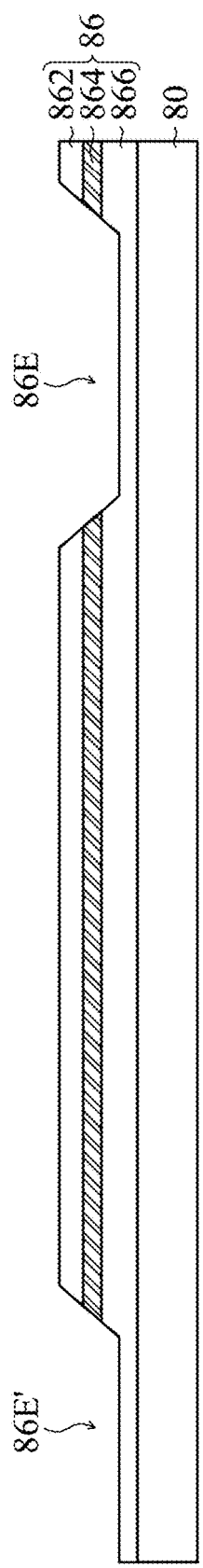
FIGS. 8A to 8F disclose a light-emitting element and manufacturing method thereof in accordance with another embodiment of the present application.
Figure 8B:
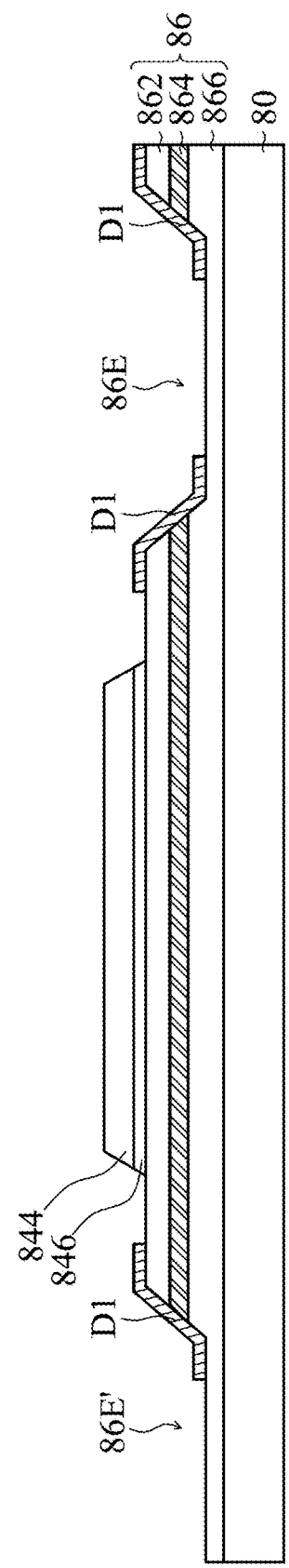
Figure 8C:
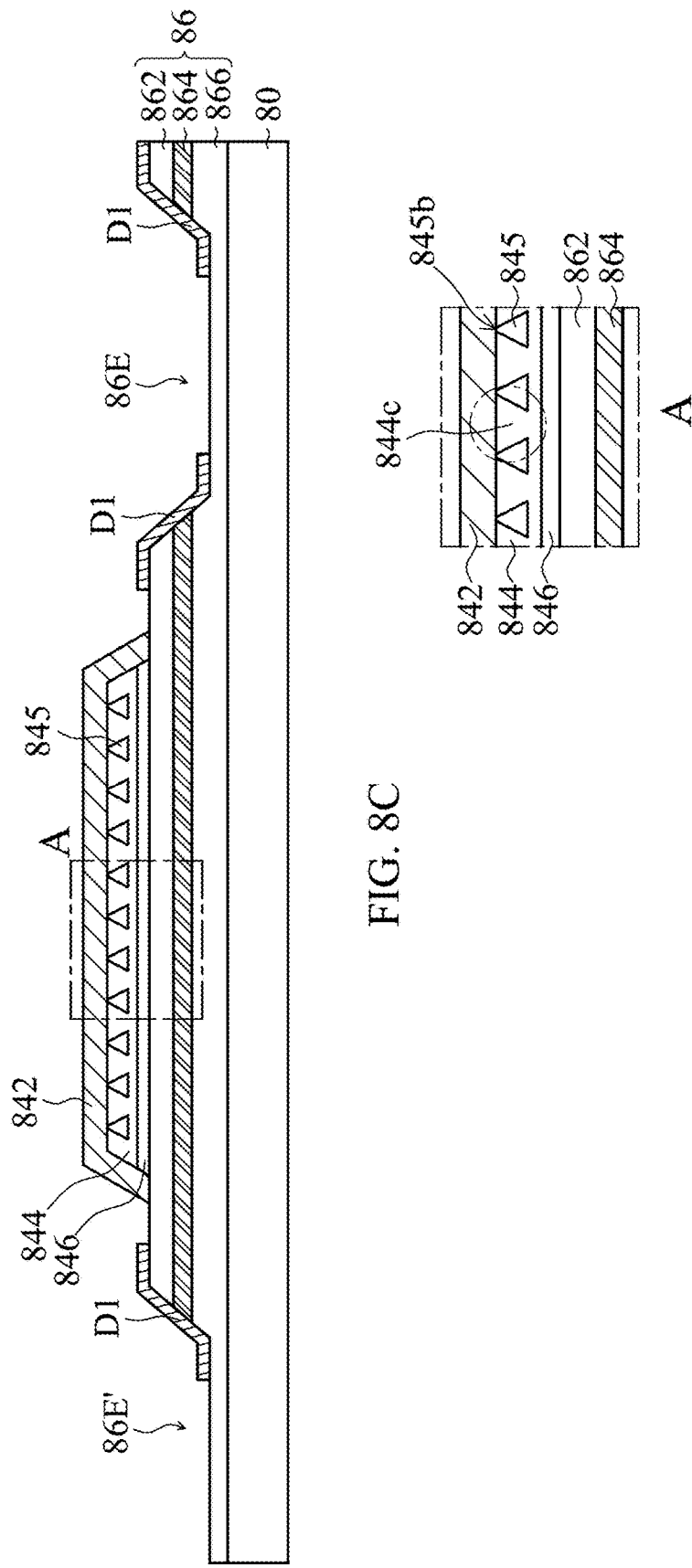
Figure 8D:
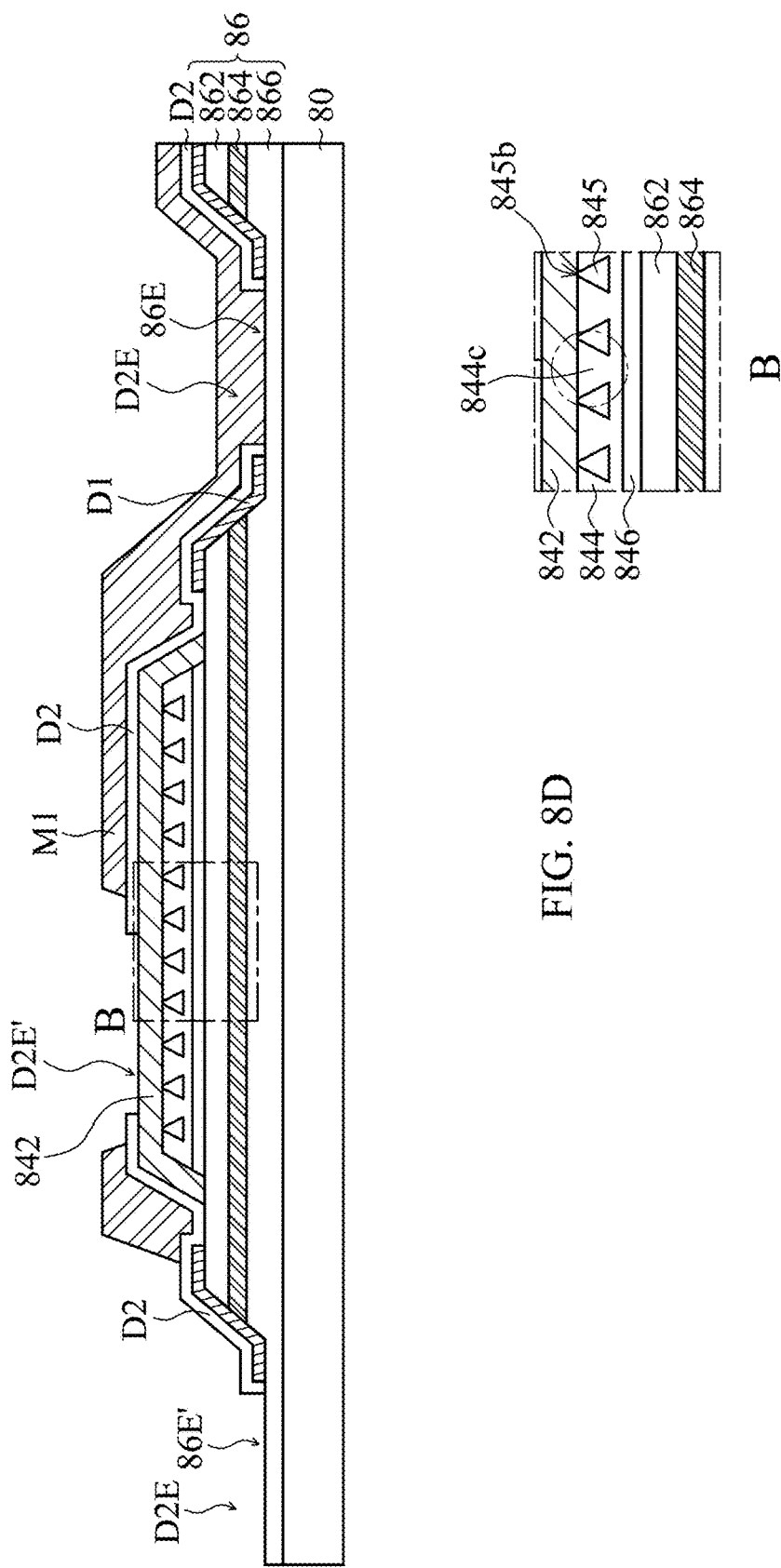
Figure 8E:
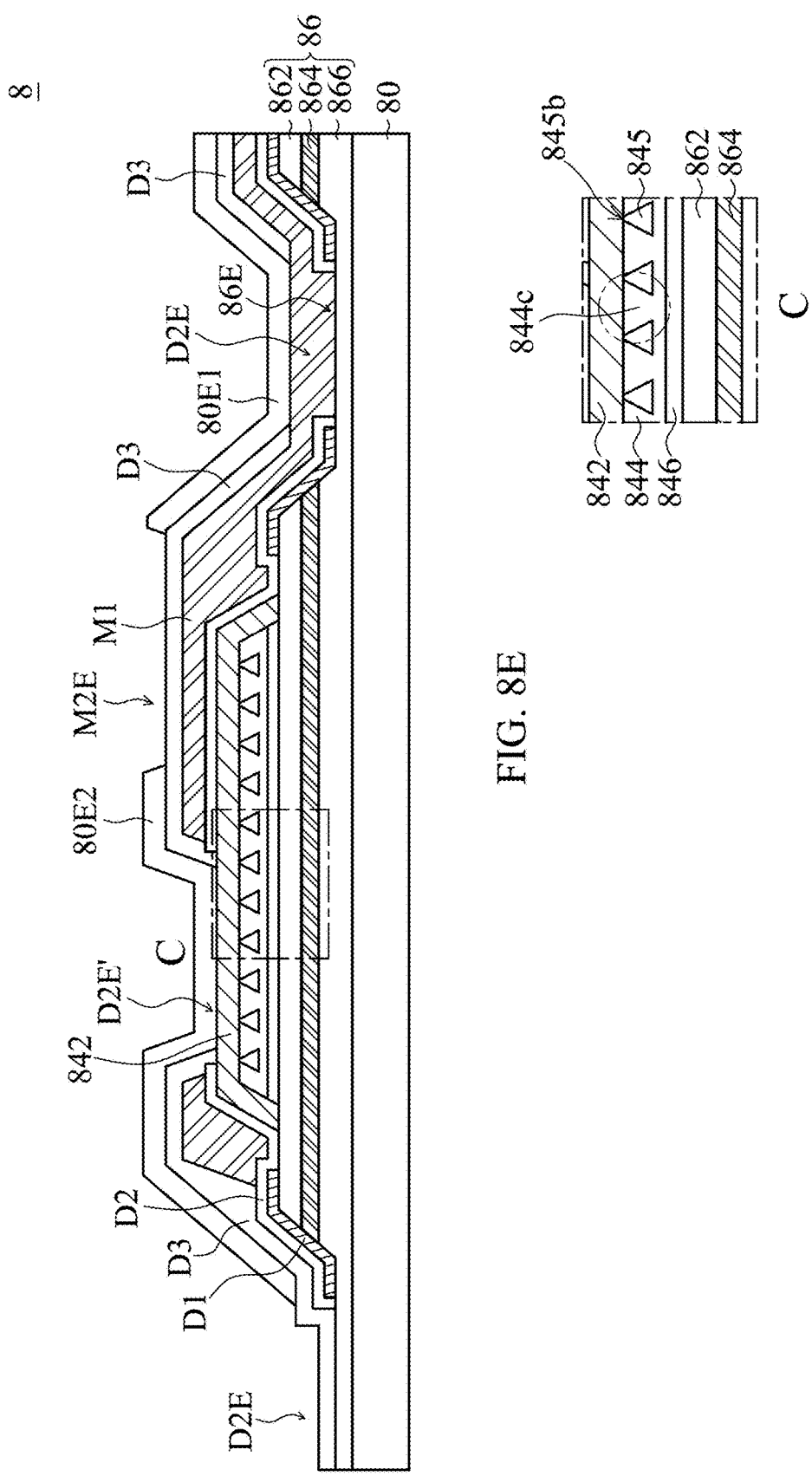
Figure 8F:
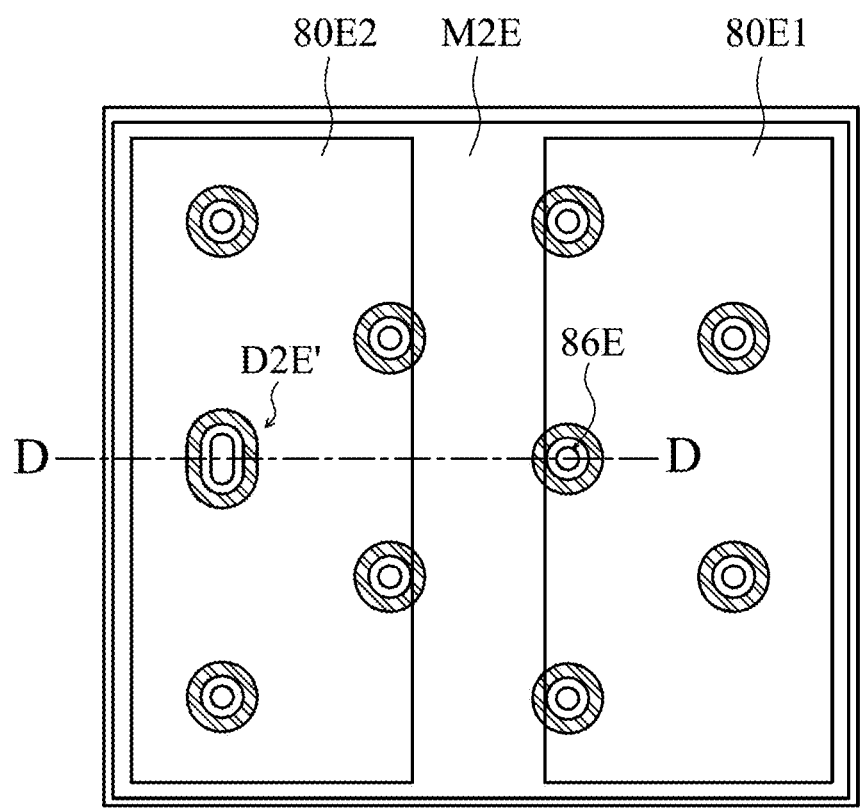

FIGS. 8A to 8E disclose a light-emitting element and the manufacturing method thereof in accordance with another embodiment of the present application. FIG. 8F shows a top view of the light-emitting element, and FIG. 8E shows a cross-section view of the light-emitting element along the cross-section line DD of FIG. 8E. As shown in FIG. 8A, the method for forming the light-emitting element comprises providing a substrate 80, such as a sapphire substrate. The method for forming the light-emitting element further comprises forming a light-emitting stack 86 on the substrate 80. The light-emitting stack 86 comprises a semiconductor stack which comprises sequentially a first semiconductor layer 862, an active layer 864, and a second semiconductor layer 866. The first semiconductor layer 862 and the second semiconductor layer 866 are of different conductive types. For example, the first semiconductor layer 862 is a p-type semiconductor layer, and the second semiconductor layer 866 is an n-type semiconductor layer. The first semiconductor layer 862, the active layer 864, and the second semiconductor layer 866 comprise III-V group material, such as $Al_xIn_yGa_{(1-x-y)}N$ (0≤x≤1, 0≤y≤1, 0≤x+y≤1) materials. Next, a lithography process and an etching process are performed to remove a part of the first semiconductor layer 862 and the active layer 864 at exposed areas 86E, 86E' to expose a part of the second semiconductor layer 866. The second semiconductor layer 866 may be partially etched because of over etching. Next, as shown in FIG. 8B, a first dielectric layer D1 is formed on substantially sidewalls of the light-emitting stack 86. Then, a first transparent layer 844 is formed substantially on the first semiconductor layer 862. A second transparent layer 846 can be optionally formed before the first transparent layer 844 is formed. In one embodiment, the second transparent layer 846 forms an ohmic contact with the first semiconductor layer 862. In another embodiment, the second transparent layer 846 enhances the adhesion or the ability of the current spreading between the first transparent layer 844 and the light-emitting stack 86. The materials of the first transparent layer 844 and the second transparent layer 846 are transparent to light emitted by the light-emitting stack 86. The material of the first transparent layer 844 and the second transparent layer 846 comprise a transparent conductive material which includes but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Zinc Oxide (IZO), Diamond-like Carbon (DLC), Indium Gallium Oxide (IGO), Gallium Aluminum Zinc Oxide (GAZO), or the combination thereof. In the present embodiment, the first transparent layer 844 comprises Indium-Tin Oxide (ITO) and the second transparent layer 846 comprises Indium Zinc Oxide (IZO). In one embodiment, the first transparent layer 844 comprises a first transparent conductive oxide and the second transparent layer 846 comprises a second transparent conductive oxide different from the first transparent conductive oxide.

Next, as shown in FIG. 8C, the method further comprises forming cavities 845 in the first transparent layer 844. Similarly, the first transparent layer 844 comprises a plurality of rods 844c, wherein one of rods 844c is as the one marked in the circle in a lower right magnified diagram of the figure for clearer illustration, and the rod 844c is surrounded by the cavities 845. The detail of the methods for forming the cavities 845 and the rods 844c, and the structures of the cavities 845 and the rods 844c are substantially the same as those illustrated in the foregoing embodiment and are not described again. After forming the cavities 845, de-ionized water may be used to rinse the first transparent layer 844. The method optionally comprises performing a thermal treatment to the first transparent layer 844 to reduce the sheet resistance of the first transparent layer 844. Then a reflective layer 842 is formed on the first transparent layer 844. Because the opening of the cavity 845 is small enough, the reflective layer 842 does not fill into the cavity 845 and leave an air gap in the cavity 845. In the present embodiment, the reflective layer 842 also covers sidewalls of the first transparent layer 844 and the second transparent layer 846. The reflective layer 842 comprises metal material, such as gold (Au), silver (Ag), or aluminum (Al). The reflective layer 842, the first transparent layer 844, and/or the second transparent layer 846 together form an Omni-Directional Reflector (ODR).

As shown in FIG. 8D, the method further comprises forming a second dielectric layer D2 on the reflective layer 842, the first dielectric layer D1, and the light-emitting stack 86. A part of the second dielectric layer D2 is removed in exposed areas D2E, D2E' to expose the second semiconductor layer 866 and a part of the reflective layer 842, wherein the exposed area D2E is substantially corresponding to the exposed area 86E. The method further comprises forming a conductive layer M1 on the second dielectric layer D2 and the second semiconductor layer 866. The conductive layer M1 contacts the second semiconductor layer 866.

Next, as shown in FIG. 8E, the method further comprises forming a third dielectric layer D3 on the second dielectric layer D2, the conductive layer M1, and the reflective layer 842, and the second semiconductor layer 866. A part of the third dielectric layer D3 is removed substantially in exposed areas D2E' to expose the reflective layer 842. The method further comprises forming a second conductive layer on the third dielectric layer D3, the reflective layer 842, and the conductive layer M1, and then removing substantially a part of the second conductive layer in an area M2E to form a first electrode 80E1 and a second bonding pad 80E2. The first bonding pad 80E1 contacts the conductive layer M1, and the conductive layer M1 contacts the second semiconductor layer 866. In other words, the conductive layer M1 functions as an intermediate conductive material and is electrically coupled to the first bonding pad 80E1 and the second semiconductor layer 866. A power supply provides a current to the second semiconductor layer 866 through the first bonding pad 80E1 and the conductive layer M1. The second bonding pad 80E2 contacts the reflective layer 842. A power supply provides a current to the first semiconductor layer 862 through the second bonding pad 80E2, the reflective layer 842, and the first transparent layer 844.

Figure 9A:
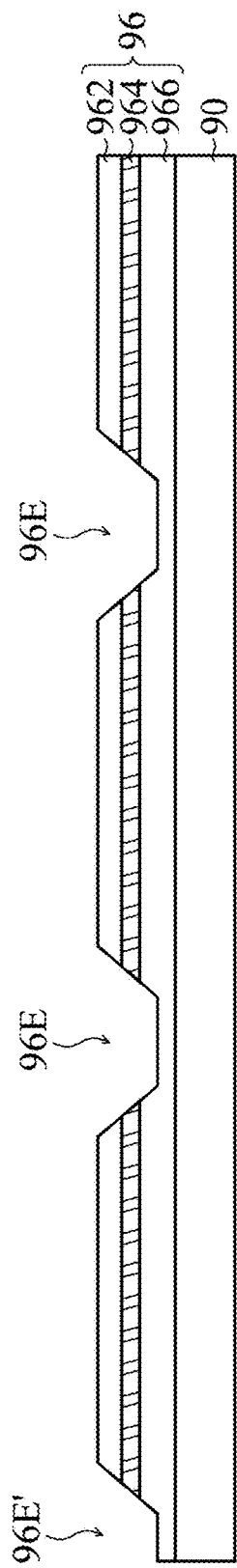
FIGS. 9A to 9F disclose a light-emitting element and manufacturing method thereof in accordance with another embodiment of the present application.
Figure 9B:
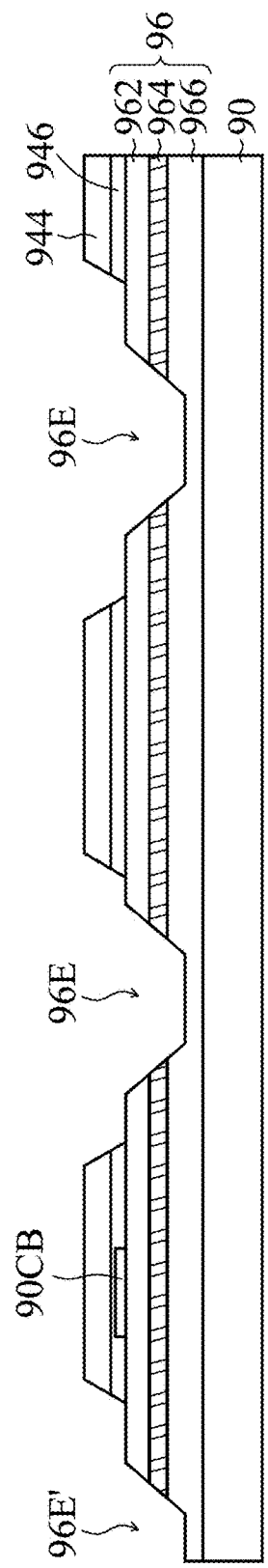
Figure 9C:
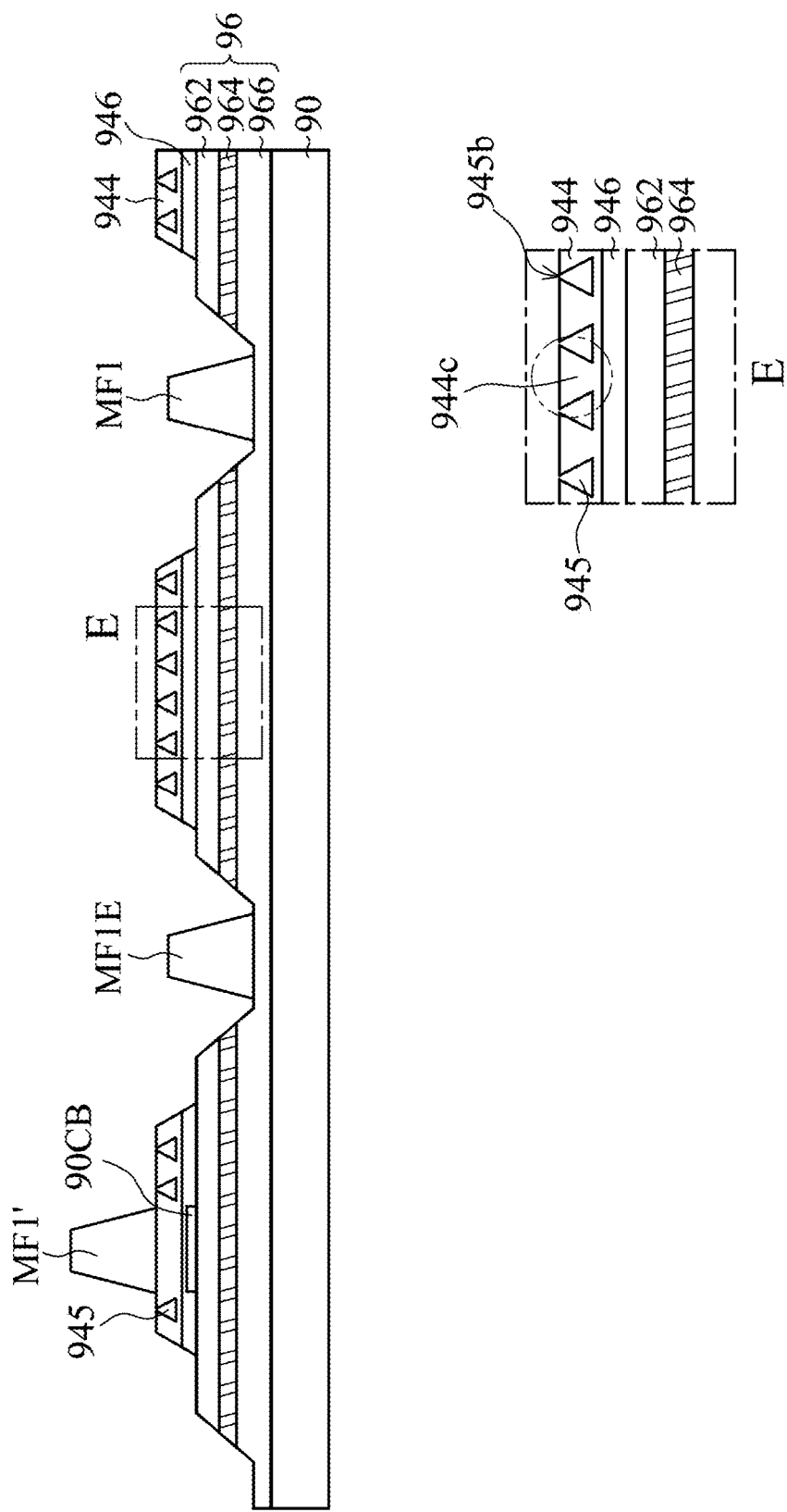
Figure 9D:
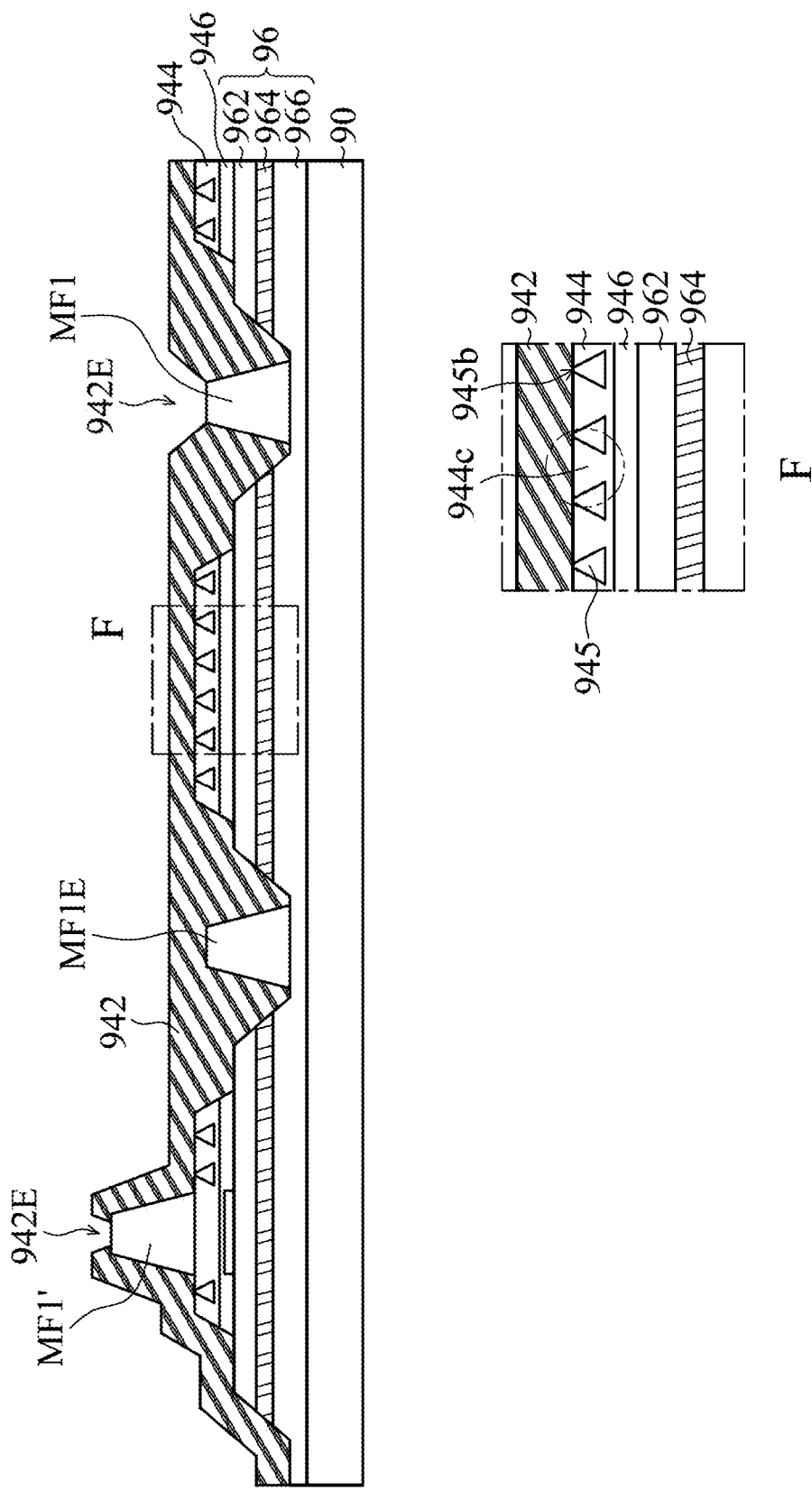
Figure 9E:
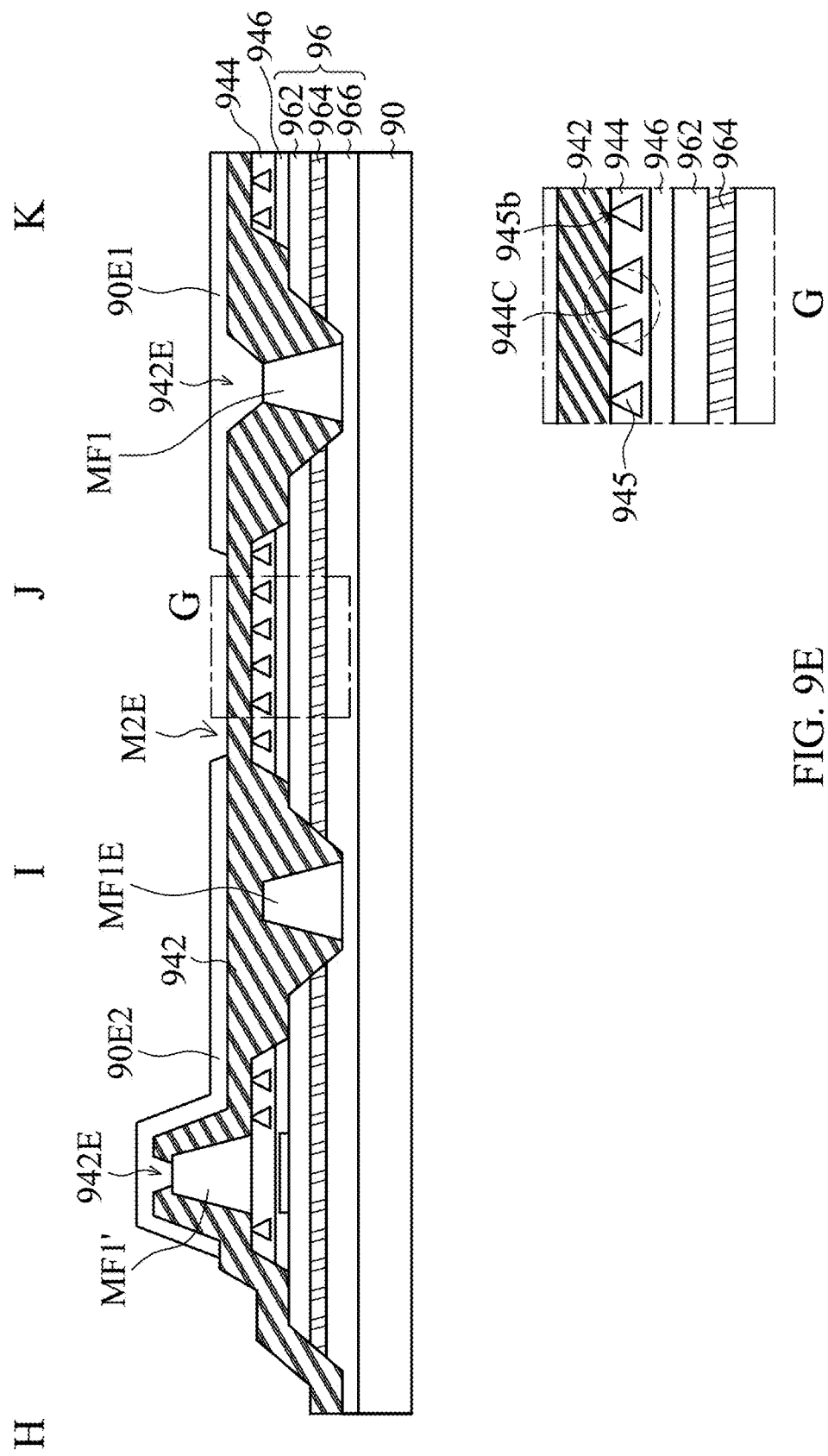
Figure 9F:
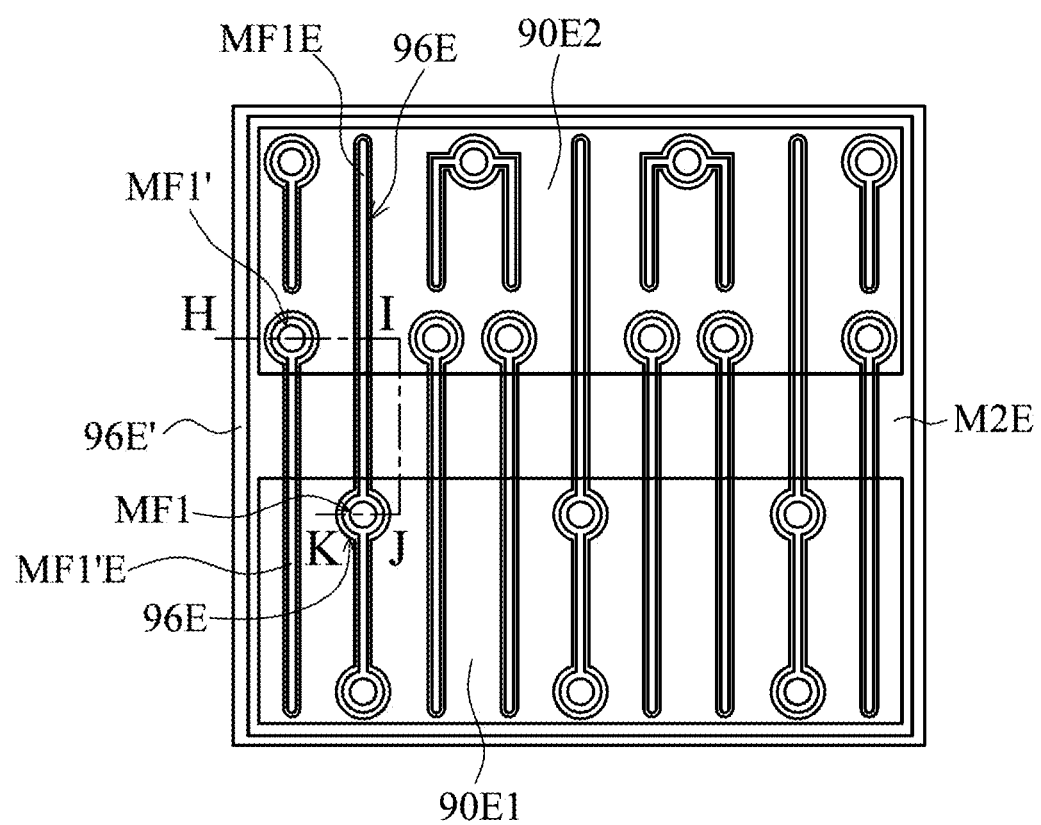

FIGS. 9A to 9E disclose a light-emitting element and the manufacturing method thereof in accordance with another embodiment of the present application. FIG. 9F shows a top view of the light-emitting element, and FIG. 9E shows a cross-section view of the light-emitting element along the cross-section line HIJK of FIG. 9E. As shown in FIG. 9A, the method for forming the light-emitting element comprises providing a substrate 90, such as a sapphire substrate. The method for forming the light-emitting element further comprises forming a light-emitting stack 96 on the substrate 90. The light-emitting stack 96 comprises a semiconductor stack which comprises sequentially a first semiconductor layer 962, an active layer 964, and a second semiconductor layer 966. The first semiconductor layer 962 and the second semiconductor layer 966 are of different conductive types. For example, the first semiconductor layer 962 is a p-type semiconductor layer, and the second semiconductor layer 966 is an n-type semiconductor layer. The first semiconductor layer 962, the active layer 964, and the second semiconductor layer 966 comprise III-V group material, such as $Al_xIn_yGa_{(1-x-y)}N$ ($0 \leq x \leq 1$, $0 \leq y \leq 1$, $0 \leq x+y \leq 1$) materials. Next, a lithography process and an etching process are performed to remove a part of the first semiconductor layer 962 and the active layer 964 in exposed areas 96E, 96E' to expose a part of the second semiconductor layer 966. The second semiconductor layer 966 may be partially etched because of over etching in exposed areas 96E, 96E'. Next, as shown in FIG. 9B, a current blocking layer 90CB may optionally be formed. The current blocking layer 90CB comprises a dielectric material to block an electric current from flowing through it. Then, a first transparent layer 944 is formed substantially on the first semiconductor layer 962 and on the current blocking layer 90CB. A second transparent layer 946 may be optionally formed before the first transparent layer 944 is formed. In one embodiment, the second transparent layer 946 forms an ohmic contact with the first semiconductor layer 962. In another embodiment, the second transparent layer 946 enhances the adhesion or the ability of the current spreading between the first transparent layer 944 and the light-emitting stack 96. The materials of the first transparent layer 944 and the second transparent layer 946 are transparent to light emitted by the light-emitting stack 96. The material of the first transparent layer 944 and the second transparent layer 946 comprise a transparent conductive material which includes but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Zinc Oxide (IZO), Diamond-like Carbon (DLC), Indium Gallium Oxide (IGO), Gallium Aluminum Zinc Oxide (GAZO), or the combination thereof. In the present embodiment, the first transparent layer 944 comprises Indium-Tin Oxide (ITO) and the second transparent layer 946 comprises Indium Zinc Oxide (IZO). In one embodiment, the first transparent layer 944 comprises a first transparent conductive oxide and the second transparent layer 946 comprises a second transparent conductive oxide different from the first transparent conductive oxide.

Next, as shown in FIG. 9C, the method further comprises forming a cavities 945 in the first transparent layer 944. Similarly, the first transparent layer 944 comprises a plurality of rods 944c, wherein one of rods 944c is as the one marked in the circle in a lower right magnified diagram of the figure for clearer illustration, and the rod 944c is surrounded by the cavities 945. The detail of the methods for forming the cavities 945 and the rods 944c, and the structures of the cavities 945 and the rods 944c are substantially the same as those illustrated in the foregoing embodiment in FIGS. 7A to 7G and are not described again. It is noted that in the present embodiment, the cavity 945 is not formed in an area above the current blocking layer 90CB in the first transparent layer 944. After forming the cavity 945, de-ionized water may be used to rinse the first transparent layer 944. The method optionally comprises performing a thermal treatment to the first transparent layer 944 to reduce the sheet resistance of the first transparent layer 944. Then a conductive layer is formed and patterned by using a lithography process and an etching process to form an intermediate conductive layer MF1, MF1E, wherein the intermediate conductive layer MF1E is an extending finger which extends from the intermediate conductive layer MF1 in a circular shape as shown in the top view in FIG. 9F. An intermediate conductive layer MF1', MF1'E (MF1'E is not shown in FIG. 9C but is shown in FIG. 9F) is also formed at the same time, wherein the intermediate conductive layer MF1'E is an extending finger which extends from the intermediate conductive layer MF1' in a circular shape as shown in the top view in FIG. 9F. The intermediate conductive layer MF1, MF1E is formed in the exposed area 96E and on the second semiconductor layer 966. The intermediate conductive layer MF1, MF1E contacts the second semiconductor layer 966. The intermediate conductive layer MF1', MF1'E is formed on and contacts the first transparent layer 944, wherein the intermediate conductive layer MF1' is above the aforementioned current blocking layer 90CB while there is no current blocking layer 90CB under the intermediate conductive layer MF1'E.

Next, as shown in FIG. 9D, the method further comprises forming a reflective layer 942. Because the opening of the cavity 945 is small enough, the reflective layer 942 does not fill into the cavity 945 and leave an air gap in the cavity 945. In the present embodiment, a DBR (Distributed Bragg Reflector) structure 942 is formed to cover the light-emitting element while parts of the DBR structure 942 are removed in exposed areas 942E by using a lithography process and an etching process. The exposed areas 942E are substantially corresponding to the location of the intermediate conductive layer MF1, MF1'. The DBR structure 942 comprises a plurality of DBR pairs, and each of the DBR pair is composed of a layer having a high refractive index and a layer having a low refractive index. In the present embodiment, each of the DBR pair is composed of a layer of Titanium Oxide ($TiO_x$) and a layer of Silicon Oxide ($SiO_x$).

Next, as shown in FIG. 9E, the method further comprises forming a conductive layer on the DBR structure 942, and then removing substantially a part of the conductive layer in an area M2E to form a first bonding pad 90E1 and a second bonding pad 90E2. The first bonding pad 90E1 contacts the intermediate conductive layer MF1, and the intermediate conductive layer MF1 contacts the second semiconductor layer 966. In other words, the intermediate conductive layer MF1 functions as an intermediate conductive material and is electrically coupled to the first bonding pad 90E1 and the second semiconductor layer 966. In addition, the intermediate conductive layer MF1E functions as an extending finger to enhance the current spreading. A power supply provides a current to the second semiconductor layer 966 through the first bonding pad 90E1 and the intermediate conductive layer MF1, MF1E. The second bonding pad 90E2 contacts the intermediate conductive layer MF1' and the intermediate conductive layer MF1' contacts the first transparent layer 944. The first transparent layer 944 is electrically coupled to the first semiconductor layer 962. In addition, the intermediate conductive layer MF1'E (shown in FIG. 9F) functions as an extending finger to enhance the current spreading. A power supply provides a current to the first semiconductor layer 962 through the second bonding pad 90E2 and the intermediate conductive layer MF1', MF1'E, and the first transparent layer 944 (and the second transparent layer 946, if the second transparent layer 946 is optionally formed).

Although the present application has been explained above, it is not the limitation of the range, the sequence in practice, the material in practice, or the method in practice. Any modification or decoration for present application is not detached from the spirit and the range of such.

What is claimed is:

1. A light-emitting device, comprising:
a reflective layer;
a first transparent layer on the reflective layer;
a light-emitting stack comprising an active layer on the first transparent layer;
a second transparent layer between the first transparent layer and the light-emitting stack; and
a cavity in the first transparent layer and without penetrating through the first transparent layer.

2. The light-emitting device as claimed in claim 1, wherein a width of the cavity which is closer to the light-emitting stack is wider than that of the cavity which is remoter from the light-emitting stack.

3. The light-emitting device as claimed in claim 1, wherein the first transparent layer comprises a plurality of rods, and each of the rods comprises substantially a cross-sectional shape of a trapezoid.

4. The light-emitting device as claimed in claim 1, wherein the first transparent layer comprises a first transparent conductive oxide, and the second transparent layer comprises a second transparent conductive oxide different from the first transparent conductive oxide.

5. The light-emitting device as claimed in claim 1, wherein the second transparent layer forms an ohmic contact with the light-emitting stack.

6. The light-emitting device as claimed in claim 1, wherein the reflective layer comprises metal material or a DBR (Distributed Bragg Reflector) structure.

7. The light-emitting device as claimed in claim 3, wherein the rod comprises a truncated cone or a truncated pyramid.

8. The light-emitting device as claimed in claim 3, wherein the trapezoid comprises a top base larger than ⅓ of a bottom base.

9. The light-emitting device as claimed in claim 1, wherein the cavity comprises substantially a cross-sectional shape of a triangle or a trapezoid.

10. The light-emitting device as claimed in claim 1, wherein the reflective layer covers sidewalls of the first transparent layer and the second transparent layer.

11. The light-emitting device as claimed in claim 10, wherein the light-emitting stack further comprises a first semiconductor layer between the active layer and the second transparent layer, and a second semiconductor layer on the active layer.

12. The light-emitting device as claimed in claim 11, wherein a part of the first semiconductor layer and the active layer is removed to expose the second semiconductor layer.

13. The light-emitting device as claimed in claim 12, further comprising a conductive layer contacting the exposed second semiconductor layer, and a bonding pad for a power supply to the light-emitting device electrically coupled to the conductive layer.

14. The light-emitting device as claimed in claim 1, wherein the cavity has a maximum height, the first transparent layer has a thickness, and the maximum height is less than the thickness.

15. The light-emitting device as claimed in claim 1, wherein the cavity is an air gap.

16. The light-emitting device as claimed in claim 1, wherein the first transparent layer has a top surface and a bottom surface opposite to the top surface, the cavity has a bottom face, and the bottom face is between the top surface and the bottom surface of the first transparent layer.

17. The light-emitting device as claimed in claim 1, wherein the cavity is only in the first transparent layer and without extending into a layer adjacent to the first transparent layer.

18. The light-emitting device as claimed in claim 1, wherein the first transparent layer comprises a base part and multiple rods on the base part, the multiple rods are substantially separated from each other by the cavity, and the cavity is overlapped with the base part of the first transparent layer in a vertical direction.

19. A light-emitting device, comprising:
- a reflective layer;
- a first transparent layer on the reflective layer;
- a light-emitting stack comprising an active layer on the first transparent layer;
- a cavity in the first transparent layer; and
- a second transparent layer between the first transparent layer and the light-emitting stack.

\* \* \* \* \*